United States Patent [19]

Pennaz

[11] Patent Number: 5,308,390
[45] Date of Patent: May 3, 1994

[54] INK COMPOSITION AND METHOD OF MAKING AND USING SUCH COMPOSITION

[75] Inventor: Thomas J. Pennaz, Brooklyn Park, Minn.

[73] Assignee: Deluxe Corporation, St. Paul, Minn.

[21] Appl. No.: 41,794

[22] Filed: Apr. 1, 1993

Related U.S. Application Data

[63] Continuation-in-part of Ser. No. 946,762, Sep. 17, 1992, abandoned.

[51] Int. Cl.$^5$ ............................................. C09D 11/02
[52] U.S. Cl. .............................. 106/20 R; 106/27 R; 106/29 R; 106/30 R; 523/160
[58] Field of Search ............... 106/20 R, 30 R, 27 R, 106/29 R; 523/160

[56] References Cited

U.S. PATENT DOCUMENTS

| | | | |
|---|---|---|---|
| 437,780 | 10/1890 | Higgins | 106/27 R |
| 1,070,713 | 8/1913 | Meckbach | 106/27 R |
| 1,822,533 | 9/1931 | Lasher | 106/31 R |
| 2,139,092 | 12/1938 | Neidich | 106/27 R |
| 2,346,968 | 4/1944 | Jeuck et al. | 106/30 R |
| 2,350,523 | 6/1944 | O'Neal | 106/27 R |
| 2,365,363 | 12/1944 | Swain | 106/27 R |
| 2,427,921 | 9/1947 | Pfaelzer | 106/27 R |
| 2,621,130 | 12/1952 | Cutler | 106/30 A |
| 2,720,461 | 10/1955 | Voet | 106/30 B |
| 3,289,577 | 12/1966 | Uhlig | 106/2 |
| 3,383,391 | 5/1968 | Carlick et al. | 106/27 R |
| 3,404,014 | 10/1968 | Drautz | 106/30 R |
| 3,434,987 | 3/1969 | Dhein et al. | 106/252 |
| 3,471,415 | 10/1969 | Friedman et al. | 524/145 |
| 3,533,811 | 10/1970 | Clements et al. | 106/24 B |
| 3,597,376 | 8/1971 | Tashiro | 106/27 R |
| 3,652,469 | 3/1972 | Glaser et al. | 106/27 R |
| 3,660,329 | 5/1972 | Wysocki | 106/30 R |
| 3,776,865 | 12/1973 | Glaser et al. | 106/27 R |
| 3,804,640 | 4/1974 | Buckwalter | 106/27 A |
| 3,844,994 | 10/1974 | Vijayendran | 106/20 R |
| 3,847,850 | 11/1974 | Rudolphy | 106/27 R |
| 3,850,648 | 11/1974 | Riedel et al. | 106/27 R |
| 3,890,156 | 6/1975 | Hiroharu et al. | 106/27 R |
| 3,900,436 | 8/1975 | Drawert et al. | 106/27 R |
| 3,914,195 | 10/1975 | Asai et al. | 106/27 R |
| 3,946,138 | 3/1976 | Jones | 106/27 R |
| 3,952,218 | 4/1976 | Pollard | 106/27 R |
| 3,981,730 | 9/1976 | Takahashi et al. | 106/27 R |
| 4,026,794 | 5/1977 | Mauceri | 210/708 |
| 4,069,179 | 1/1978 | Jones | 106/27 R |
| 4,072,644 | 2/1978 | Hedrick | 524/548 |
| 4,077,807 | 3/1978 | Kramer et al. | 106/30 R |
| 4,137,083 | 1/1979 | Hedrick | 106/20 R |
| 4,155,886 | 5/1979 | DeGoler | 106/19 R |
| 4,163,001 | 7/1979 | Carumpalos et al. | 106/20 R |
| 4,183,833 | 1/1980 | Miyaguchi et al. | 106/27 R |
| 4,221,686 | 9/1980 | Sakiyama et al. | 106/27 R |
| 4,229,747 | 10/1980 | Hwang | 106/22 R |
| 4,256,619 | 3/1981 | Miyaguchi et al. | 524/571 |
| 4,330,450 | 5/1982 | Lipowski | 524/547 |
| 4,361,843 | 11/1982 | Cooke et al. | 106/27 R |
| 4,363,886 | 12/1982 | Lipowski et al. | 523/336 |
| 4,385,149 | 5/1983 | Tsuchiya et al. | 106/20 R |
| 4,386,961 | 6/1983 | Lin | 106/27 R |
| 4,388,434 | 6/1983 | Swift et al. | 524/476 |
| 4,392,917 | 7/1983 | Lipowski et al. | 162/168.1 |
| 4,400,215 | 8/1983 | Cook et al. | 106/27 R |
| 4,419,132 | 12/1983 | Moynihan | 106/27 R |
| 4,484,948 | 11/1984 | Merritt et al. | 106/30 R |
| 4,505,828 | 3/1985 | Lipowski et al. | 252/8.554 |

(List continued on next page.)

OTHER PUBLICATIONS

The Printing Ink Manual, Fourth Edition (1988) edited by R. H. Leach and published by Van Nostrand Reinhold.

*Primary Examiner*—Helene Klemanski
*Attorney, Agent, or Firm*—Dorsey & Whitney

[57] ABSTRACT

An ink composition comprising a water reducible resin and a compatible surfactant wherein the ink composition is water insoluble under certain pH conditions and selectively water washable under certain other alkaline pH conditions. The method aspect of the present invention relates to a method of making and using the ink composition.

15 Claims, No Drawings

U.S. PATENT DOCUMENTS

| | | | |
|---|---|---|---|
| 4,508,868 | 4/1985 | Whysmuzis et al. | 106/27 R |
| 4,514,540 | 4/1985 | Peck | 106/20 R |
| 4,519,841 | 5/1985 | Moynihan | 106/27 R |
| 4,528,036 | 7/1985 | Rudolphy | 106/30 C |
| 4,531,976 | 7/1985 | Lin | 106/27 R |
| 4,552,592 | 11/1985 | Rudolphy et al. | 106/30 C |
| 4,552,670 | 11/1985 | Lipowski | 507/120 |
| 4,554,019 | 11/1985 | Moynihan | 106/27 R |
| 4,556,427 | 12/1985 | Lewis | 106/27 R |
| 4,579,888 | 4/1986 | Kodama et al. | 106/20 R |
| 4,589,920 | 5/1986 | Kanada et al. | 106/30 R |
| 4,595,518 | 6/1986 | Raynolds et al. | 252/8.6 |
| 4,612,051 | 9/1986 | Miller et al. | 106/30 R |
| 4,648,905 | 3/1987 | Peck et al. | 106/27 R |
| 4,659,380 | 4/1987 | Winters et al. | 106/14.14 |
| 4,664,710 | 5/1987 | Gleason et al. | 106/23 D |
| 4,664,711 | 5/1987 | Kawaguchi et al. | 106/30 R |
| 4,699,660 | 10/1987 | Frank et al. | 106/20 R |
| 4,732,616 | 3/1988 | Kondo et al. | 106/20 R |
| 4,747,882 | 5/1988 | Schwartz et al. | 106/23 R |
| 4,758,276 | 7/1988 | Lin et al. | 106/27 A |
| 4,760,104 | 7/1988 | Miyagima et al. | 106/27 R |
| 4,765,243 | 8/1988 | Schiefer et al. | 106/20 R |
| 4,783,220 | 11/1988 | Gamble et al. | 106/27 R |
| 4,789,399 | 12/1988 | Williams et al. | 106/20 R |
| 4,810,747 | 3/1989 | Bornack et al. | 524/538 |
| 4,822,419 | 4/1989 | Pepoy et al. | 106/20 R |
| 4,853,421 | 8/1989 | Hayes | 523/223 |
| 4,870,139 | 9/1989 | Kveglis et al. | 525/420.5 |
| 4,886,553 | 12/1989 | Gillich | 134/42 |
| 4,886,844 | 12/1989 | Hayes | 523/223 |
| 4,891,070 | 1/1990 | Dilling et al. | 106/26 R |
| 4,904,303 | 2/1990 | Rudolphy et al. | 106/30 R |
| 4,938,801 | 7/1990 | Yoshioka et al. | 106/20 R |
| 4,942,111 | 7/1990 | Wade et al. | 430/273 |
| 4,943,430 | 7/1990 | Hefford et al. | 424/70 |
| 4,944,768 | 7/1990 | Balliello et al. | 8/524 |
| 4,960,464 | 10/1990 | Chen | 106/27 R |
| 4,963,188 | 10/1990 | Parker | 106/20 R |
| 4,966,628 | 10/1990 | Amon et al. | 106/20 R |
| 4,982,661 | 1/1991 | Zweig | 101/451 |
| 4,990,185 | 2/1991 | Kashnan | 106/20 R |
| 5,004,763 | 4/1991 | Imagawa | 523/161 |
| 5,009,716 | 4/1991 | Gerson | 134/40 |
| 5,015,711 | 5/1991 | Simonet et al. | 526/301 |
| 5,017,228 | 5/1991 | Goda | 106/20 R |
| 5,021,538 | 6/1991 | Crews | 528/129 |
| 5,026,755 | 6/1991 | Kveglis et al. | 106/20 R |
| 5,030,683 | 7/1991 | Nakamura | 524/512 |
| 5,041,161 | 8/1991 | Cooke et al. | 106/27 R |
| 5,066,331 | 11/1991 | Hutter | 106/20 R |
| 5,074,915 | 12/1991 | Yoshioka et al. | 106/30 R |
| 5,077,348 | 12/1991 | Nakamura et al. | 524/512 |
| 5,084,333 | 1/1992 | Beach et al. | 428/272 |
| 5,087,659 | 2/1992 | Fujisawa | 524/594 |
| 5,098,478 | 3/1992 | Kirshnan et al. | 106/20 R |
| 5,100,718 | 3/1992 | Weintraub | 428/195 |
| 5,100,934 | 3/1992 | Glesias | 106/20 R |
| 5,101,010 | 3/1992 | Dickens et al. | 106/20 R |
| 5,102,856 | 4/1992 | Doll et al. | 523/161 |
| 5,104,449 | 4/1992 | Pavlin | 106/30 R |
| 5,104,567 | 4/1992 | Staehr | 252/174.17 |
| 5,106,416 | 4/1992 | Moffatt et al. | 106/20 D |
| 5,114,478 | 5/1992 | Auslander et al. | 106/30 R |
| 5,116,409 | 5/1992 | Moffatt | 106/20 R |
| 5,118,583 | 6/1992 | Kondo et al. | 430/309 |
| 5,127,948 | 7/1992 | Sheperd | 106/30 R |
| 5,234,577 | 8/1993 | Van Slyke | 208/13 |

INK COMPOSITION AND METHOD OF MAKING AND USING SUCH COMPOSITION

This a continuation-in-part of Ser. No. 07/946,762 filed Sep. 17, 1992 now abandoned.

BACKGROUND OF THE INVENTION

1. Field of the Invention

The present invention relates generally to the field of ink compositions or to the field of oil based compositions usable in lithography, and more particularly to a lithographic ink composition in which its relationship with aqueous solutions, including its solubility, can be selectively controlled. The compositions of the present invention are unaffected by water, and thus generally water insoluble, at certain selected generally acidic pH levels and water washable at certain other selected generally alkaline pH levels. The present invention also relates to methods of making and using such compositions.

2. Summary of the Prior Art

A wide variety of printing processes currently exist in the art. Although it is contemplated that the ink composition and method of the present invention may have applicability to many of these prior processes, it has particular applicability to a lithographic printing process commonly referred to as lithography. Lithography is a method of printing which relies on differences in solubility and surface wetability between an oil based component and an aqueous or aqueous based component to effectively transfer the printing ink to the desired image area and prevent it from transferring to the nonimage areas.

The printing apparatus commonly used in a lithographic process includes a printing plate which is treated to provide an oleophilic ink-accepting image area and an oleophobic ink-repelling nonimage area. Generally, the oleophilic or oil attracting image areas are hydrophobic or water repelling, and the oleophobic or oil repelling nonimage areas are hydrophilic or water attracting.

During a conventional lithographic printing process, an oil based ink composition and an aqueous fountain solution are applied to the printing plate. Because of the solubility and the wetability differences of the oil based and aqueous compositions, the fountain solution is preferentially attracted to and preferentially wets the oleophobic nonimage areas, while the ink is preferentially attracted to and preferentially wets the oleophilic image areas. It is well known and accepted in the art that successful lithographic printing requires inks which exhibit stability relative to water and thus remain water insoluble. Absence of this characteristic will result in poor print quality, poor edge definition and various other print deficiencies Thus, lithographic inks are selected and formulated for their ability to remain stable, cohesive and insoluble when contacted with water. The simultaneous feeding of the ink composition and fountain solution to the print plate is accomplished through a variety of methods and roller configurations known in the art.

In the course of lithographic printing, the printing plates will be periodically changed as one job is completed and another started. Whenever this occurs, the blanket cylinder in an offset process must be cleaned to remove ink residue which is present from the previous job. Further, if a change of ink is desired, the entire print train including the application rollers, the print plate and the blanket must be cleaned. Such cleaning is commonly accomplished using an appropriately formulated wash solvent. To be effective as a wash solvent, the wash must be compatible with, or be able to dissolve, the ink. Since the inks are oil based and have been formulated to be insoluble in water, this normally requires the use of organic or petroleum based wash solvents to effectively remove the ink from the rollers, printing plates, blanket cylinder, etc.

These organic wash solvents can give rise to employee safety concerns and are a large source of both air and water pollution as volatile organic compounds (VOC's) are dispersed into the atmosphere or disposal systems. Such pollution is due to evaporation into the ambient air or into a venting system during the washing of the print components as well as the disposal or laundering of shop towels and rags used in the cleaning process. Attempts to develop water based washes or cleaning solutions have not been successful due to the inherent ability of the ink to resist water. Attempts have also been made to use water/solvent mixtures by emulsifying petroleum-based solvents into water through the use of emulsifiers and surfactants, but these products suffer from inherent instability due to immiscibility of water and the solvents and perform slowly. Further, such mixtures do not completely eliminate the use of petroleum solvents which are still commonly present in an amount of about 30–80%. Other industry trends include the use of solvents such as terpenes. While not petroleum based, their performance has been marginal and they are costly and in short supply. In addition, their use and disposal also pose environmental concerns.

Some attempts have been made to eliminate VOCs during the clean up of lithographic ink using vegetable oil/emulsifier blends or fatty acids/nonionic surfactant mixtures. See U.S. Pat. No. 5,009,716 and 5,104,567 issued to Gerson and Staehr, respectively. In both applications, relatively large quantities of wash solutions are required to fully clean and flush the equipment. Further, when clean up is completed, many of the same problems of biodegradability, environmental and disposal exist with respect to the wash solution and removed ink composition.

Thus, although offset lithography is recognized and established as a dominant printing process for certain applications, drawbacks exist because of the pollution problems referred to above. These are becoming more of a drawback and more of a problem as new pollution control regulations and standards are mandated. In fact, because of the very nature of the lithographic process at least one of the components (either the ink composition or the fountain solution) must be oil based. Thus, the clean up of the lithographic apparatus normally requires the use of an organic or petroleum based solvent or other compositions posing biodegradability environmental or disposal problems. This is generally accepted as a necessary limitation of the lithographic process about which little can be done. Accordingly, there is a need in the art to address this particular limitation and to substantially reduce if not eliminate these pollution concerns.

SUMMARY OF THE INVENTION

In contrast to the prior art, the present invention relates generally to an oil based ink composition or to an oil based composition usable in a lithographic process in which such compositions can be washed with an aqueous wash solution to thereby significantly reduce, if not eliminate, pollution and safety concerns while still maintaining highly acceptable print quality. The invention also relates to a method for making such a composition and a method of using the composition in a lithographic printing process.

A preferred embodiment of the present invention is based upon an improved oil based ink composition in which the solubility or washability of the composition relative to an aqueous or aqueous based solution can be selectively controlled, while at the same time exhibiting acceptable print quality and acceptable stability during printing. More specifically, the improved ink composition of the present invention is formulated so that its solubility or washability relative to an aqueous solution can be selectively controlled by varying the pH level of such solution. This facilitates the use of an aqueous fountain solution with a first pH level during the printing process in which the ink composition is stable and insoluble and can therefore print lithographically, and the use of an aqueous wash solution with a second, generally alkaline pH level during clean up in which the ink composition is soluble or washable. Such an ink composition eliminates the need for organic or petroleum based cleaning or washing solvents which in turn minimizes or eliminates pollution and employee safety concerns, while still achieving acceptable print quality.

More simply stated, the preferred ink composition of the present invention must be water insoluble during printing, but be capable of becoming selectively soluble or washable in an alkaline solution when clean-up is desired. In applicant's related application Ser. No. 07/946,762 filed Sep. 17, 1992, the entirety of which is incorporated herein by reference, an ink composition containing compatible water reducible resins was disclosed. These resins were present in an amount sufficient to provide the resulting ink composition with pH dependent water solubility behavior. In other words, the ink composition exhibited water insoluble characteristics during printing at acidic pH levels and water solubility or washability at alkaline pH levels to facilitate aqueous clean up.

In accordance with the present invention, various surfactants or surfactant blends have been shown to facilitate reduction of the water reducible resin component of the ink composition of applicant's related application identified above while still maintaining acceptable print quality and clean up capability.

Although the preferred embodiment contemplates an ink composition which is incorporated into the oil based component and a fountain solution which is aqueous based, these would be reversed. In such a case, the water solubility or washability of the oil based fountain solution would be changed when clean up is desired. It is also contemplated that the oil based ink composition of the present invention may have usefulness in print processes other than lithography where use of an oil based ink which can be cleaned up with aqueous solution is needed or desired.

The method aspect of the present invention relates to the making and using of an ink composition or oil based component of the type contemplated by the present invention or employing the general features of such composition or component. Specifically, the method of making the ink composition or component includes the steps of combining the various composition ingredients including a resin component or ingredient having selective aqueous solubility and a compatible surfactant. The preferred method of making the ink composition or component involves formulating a resin component in which a portion, and in particular a solubility controlling portion, exhibits selective water solubility dependent on the pH of the solution with which it is contacted and combining it with the surfactant. In a preferred embodiment, the Acid Number of the solubility controlling portion is selected to provide it with these desired solubility characteristics. The preferred solubility controlling portion is a water reducible alkyd or polyester, although other water reducible resins can be used as well.

The preferred process of using the ink composition or component in lithographic printing comprises the steps of applying the ink composition and a first aqueous solution comprising an aqueous fountain solution to a printing plate, transferring the ink composition to a receiving substrate or medium and then washing the printing plate, blanket and other print components with a second aqueous solution comprising an aqueous wash. In the preferred method, the first and second aqueous solutions have acidic and alkaline pH levels, respectively, the first solution in which the ink composition is insoluble and the second solution in which the ink composition is soluble, washable or dispersible.

Accordingly, it is an object of the present invention to provide an improved oil based lithographic composition for use as, or together with, a lithographic ink composition which can be washed with an alkaline aqueous wash solution and which provides acceptable print quality.

Another object of the present invention is to provide an oil based component for a lithographic printing system in which the water solubility or washability can be selectively controlled by varying the pH of the solution which it contacts.

A still further object of the present invention is to provide an improved oil based lithographic ink composition in which its solubility or washability relative to an aqueous medium can be controlled by selectively adjusting the pH of such aqueous medium.

A still further object of the present invention is to provide a lithographic ink composition in which its water solubility or washability can be selectively controlled and which also provides acceptable stability and print qualities.

A still further object of the present invention is to provide a lithographic ink composition which utilizes as many existing lithographic ink ingredients as possible and which can print lithographically and be washed from the print blanket, rollers, etc. with an aqueous wash.

A further object of the present invention is to provide a method for making and using an oil based composition in a lithographic process, and more particularly a lithographic ink composition of the type in which the water solubility or washability can be selectively controlled.

These and other objects of the present invention will become apparent with reference to the description of the preferred composition and method and the appended claims.

DESCRIPTION OF THE PREFERRED COMPOSITION AND METHOD

The present invention relates to oil based ink compositions and to oil based lithographic compositions usable in a lithographic printing process and to various methods relating to the making and using of such compositions.

The preferred ink composition of the present invention is an oil based lithographic ink which is insoluble in water under certain conditions, but which can be selectively converted to exhibit water solubility or washability at certain other conditions. More specifically, the preferred ink composition is water soluble at certain selected pH levels while being water washable at certain selected other pH levels. As used herein, the term "washable" or "water washable" refers to a composition or component which can be removed or dispersed when exposed to certain aqueous solutions. It should be noted that in the present application "solubility" is not necessarily equated with "washability". A composition that is soluble would certainly be washable; however, the converse is not necessarily true. To be washable, a composition must be capable of removal or dispersion, either physically or through means of solubility.

Although the preferred ink composition of the present invention is oil based, it is contemplated that the concept of the present invention could also apply to a lithographic system in which the ink composition is aqueous based and the fountain solution is oil based. In such a system, the fountain solution would be water insoluble under certain conditions or at certain pH levels and water soluble or washable at certain other conditions or pH levels. It is also contemplated that an oil based ink composition in accordance with the present invention could have applicability to print processes other than lithography. Accordingly, unless otherwise specifically stated, the present invention contemplates applicability to both a conventional oil based lithographic ink composition system as well as a possible water based lithographic ink composition system and also an oil based ink composition useful in print processes other than lithographic.

In general, lithographic ink formulations comprise a variety of components or ingredients including a varnish or vehicle component, pigments, solvents or diluents and various additives. The pigments, solvents or diluents and additives provide the ink composition with certain desirable characteristics such as color, drying speed, tack, viscosity, etc. These may be considered optional, depending upon the particular characteristics desired. Pigments or coloring agents may include organic and inorganic pigments and dyes and other known colorants. Solvents or diluents are principally used to control viscosity, improve compatibility of other components, among others. Additives and other auxiliary components may include, for example, waxes, greases, plasticizers, stabilizers, drying agents, supplemental drying agents, thickeners, fillers and others known to the art.

The major component of a lithographic ink composition is commonly referred to in the industry as the lithographic ink varnish or vehicle. A lithographic ink varnish or vehicle comprises two principal components: a resin component and an oil component. An aspect of the present invention also contemplates use of a surfactant as part of the ink composition and varnish. As used herein, the term resin is used in its broadest sense to include all natural and synthetic resins capable of functioning as a component in a printing or printing ink environment. In the ink composition of the present invention, the varnish, and in particular the resin component, is formulated to provide the ink composition with the characteristic of being selectively water insoluble at certain pH levels and water soluble or washable at other pH levels.

Lithographic ink varnishes may be divided into two major classes depending upon the system of curing or drying the inks. The first system is an oleoresinous system which is generally used to produce quick set, heat set, and various other drying inks which set or dry by oxidation, absorption of the oil into the substrate, or solvent evaporation. The second system is known as an acrylic system which employs ultraviolet or electron beam radiation curing techniques. The concept of the present invention is applicable to both systems; however, the preferred composition is described with respect to an oleoresinous system.

The oil component of the ink composition or varnish of the present invention may be any one of a variety of oils or oil derivatives which are commonly used in the formulation of lithographic inks. Preferably these include, but are not necessarily limited to, vegetable and other oils such as linseed, soybean or soya, castor, dehydrated castor, corn, tung and otticita oils. Certain petroleum distillates or mineral oils can also be used in combination with or in lieu of the vegetable oils. An example of such a petroleum distillate is a solvent known as a Magie solvent which is a napthenic hydrocarbon solvent. The oil component of the ink composition or varnish functions principally to dissolve and act as a carrier for the resin component. Thus, a principal requirement of the oil component is that it be compatible with, and therefore able to dissolve, the resin component. Various oils and oil formulations which may be usable in ink compositions and in particular lithographic ink compositions are well known in the art as disclosed for example in *The Printing Ink Manual*, Fourth Edition (1988) edited by R. H. Leach and published by Van Nostrand Reinhold, the substance of which is incorporated herein by reference.

The resin component in a lithographic ink composition or varnish functions, among other things, as a film former to bind the varnish and pigment together and, when the ink dries, to bind the same to the receiving substrate. The resin component also contributes to the properties of hardness, gloss, adhesion and flexibility of an ink. In an oleoresinous system, the resin component is generally comprised of a hard resin component and a second resin component which typically is an alkyd or polyester resin, but which can comprise various other compositions and resins as well. The hard resins are normally solid at room temperatures and typically fall into two principal classes: the modified rosin ester resins and the modified hydrocarbon resins. arious hard resins or hard resin combinations or blends can be, and have been, utilized in the ink composition of the present invention providing such resins are compatible with each other, with the oil and with the alkyd, polyester or other components of the varnish. As used herein, compatibility means generally soluble with one another. Lithographic inks typically include hard resins which are comprised of natural or processed resins such as rosins, rosin esters, maleic modified resins, rosin modified fumaric resins, dimerized and polymerized rosins, asphalts such as gilsonite and the like, phenolics, rosin modified phenolics, terpenes, polyamides, cyclised rubber, acrylics, hydrocarbons and modified hydrocarbons. Also included among the available resins are those identified in *The Printing Ink Manual*, supra, the substance of which is incorporated herein by reference.

The second resin component (typically alkyds or polyesters) of the ink composition or varnish of the present invention, like the hard resins, functions to form the varnish or ink composition into a cohesive material and, upon printing, bond the pigment to the receiving substrate. However, unlike the hard resins described above, this second resin component, and in particular the polyesters or alkyds are typically not solid, but are viscous liquids. Alkyds for conventional lithographic inks are normally "cooked" so as to have all or substantially all of the acid groups reacted with all or substantially all of the hydroxyl groups. This results in a product having very low hydroxyl (OH) and carboxyl (COOH) content with an Acid umber (AN) less than 20 and often less than 10. This in turn reduces the ionic behavior of the composition to thereby increase the overall stability and water insolubility of the ink.

In accordance with the present invention, it has been found that under acidic conditions, certain ink compositions can be formulated which remain sufficiently stable (i.e. sufficiently non-ionic and water insoluble) to be useful as a lithographic ink and provide highly acceptable print quality, yet which may be readily and selectively converted to a water soluble or washable form upon a shift to alkaline conditions. This allows the lithographic ink having such qualities to be printed under acidic conditions using an aqueous fountain solution and cleaned up under alkaline conditions using an aqueous wash solution.

The characteristics of a lithographic ink composition relating to water solubility or insolubility and stability are directly related to the resin component of the system which in turn are directly related to the characteristics of the solubility controlling portion of the resin component. Preferably the solubility controlling portion of the resin component, should be water insoluble under certain conditions and water washable at others and such water solubility behavior should be pH dependent. In the preferred embodiment, this solubility controlling portion is comprised of a water reducible alkyd, polyester or other resin exhibiting the desired solubility characteristics. By selecting the alkyd, polyester or other component which is both compatible with the other varnish components and exhibits the desired solubility behavior to render it water insoluble at certain pH levels and water soluble or washable at certain others, it has been found that the resulting resin component, varnish and ink composition exhibit similar characteristics.

In the most preferred composition, the solubility controlling portion of the resin component is comprised of a water reducible alkyd or a portion of a water reducible alkyd. The water solubility characteristics of such alkyd, and thus the water solubility characteristics of the resulting varnish and ink composition is controlled by appropriate selection of the Acid Number or amount of "free" acid of the alkyd. More specifically, the alkyd and its particular Acid umber are selected so that the alkyd and the resulting ink composition or varnish is water insoluble at certain pH levels (generally acidic), while being water soluble or water washable at certain other generally alkaline pH levels. The particular Acid Number or Acid Number range which will be effective to provide the alkyd with the desired solubility characteristics will vary to some degree depending upon the particular alkyd or alkyd blend. However, those alkyds or alkyd blends useful in the present invention will have an Acid Number or Acid Number range within which they will exhibit the desired selective water solubility behavior. For most water reducible alkyds and other resins, this Acid umber range will be between about 25-150 mg KOH/gram of alkyd, and preferably in the range of about 30-100 and most preferably in the range of about 40-60.

Accordingly, the above identified Acid Number ranges define the "window" of Acid umber ranges in which the water reducible alkyd, and thus the resulting ink composition or varnish, will be water insoluble and stable at certain first pH levels and water soluble or washable at certain other second generally alkaline pH levels. The above ranges are general ranges which are applicable to most water reducible alkyds, polyesters and other resins usable in accordance with the present invention. However, this range may vary somewhat depending on the varnish composition including the particular water reducible alkyd or other resin, the particular hard resin and the particular oil selected. The lower number of the above ranges defines the transition between water insolubility and water solubility which is pH dependent. For example, in the ranges above, a water solubility transition occurs for an Acid Number range of about 25 to 35 and more particularly about 30. With Acid Numbers below this range, the alkyd and resulting composition or varnish become water insoluble regardless of the pH, while at Acid Numbers greater than 25 or 30, the water solubility or washability of the alkyd, and the resulting composition or varnish, is dependent on the pH level. The upper end of the above ranges defines the maximum Acid Number at which the water insolubility or stability of the alkyd or resulting composition or varnish can be pH controlled. Above such Acid umbers, the alkyd and thus the resulting composition or varnish tends to become more water soluble and thus unstable at all pH levels.

As used herein, the term water reducible defines a property of a resin or composition which is generally water insoluble under certain conditions (preferably pH related) and capable of being or becoming water soluble or water washable or dispersible under certain conditions (preferably pH related). Thus, the water solubility or washability behavior of a water reducible resin or composition in accordance with the preferred embodiment is pH dependent, with such resin or composition being water insoluble under acidic conditions and water washable under alkaline conditions. In other words, the "water reducible" resin or component in accordance with the present invention must be water insoluble under certain acidic pH conditions and capable of being water washed or dispersed (either physically or because of solubility) under certain other alkaline pH conditions.

For the solubility controlling portion of the resin component to cause the resulting varnish or ink composition to exhibit the desired water solubility characteristics or behavior, such solubility controlling portion must be present in an amount effective to result in such behavior. This will depend to some extent on the amount of surfactant in the ink composition since presence of a surfactant will tend to reduce the amount of solubility controlling portion needed. With the use of a surfactant within the concentrations discussed below, the solubility controlling portion, and in particular the water reducible alkyd or polyester of the preferred embodiment, should be present in an amount of at least about 2% and more preferably between about 2-60% by weight of the varnish (the oil, resin and surfactant components). Most preferably, the solubility controlling portion should be present in an amount at least about 10% or between about 10-40% by weight of the varnish.

It is also contemplated that in accordance with the preferred embodiment, the solubility controlling portion of the resin may comprise either a single water reducible alkyd or polyester, a blend of two or more such compounds or various other water reducible compounds or resins which exhibit the desired water solubility characteristics or behavior of being water insoluble under certain conditions or pH levels and water washable under certain other conditions, preferably alkaline pH levels. It has been shown that certain water reducible alkyds (Cargill's short oil alkyds 74-7450, 74-7451; Cargill's long oil alkyd 74-7416; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable providing they are compatible with the other components of the system and are present in an amount sufficient to cause the varnish and ink composition to exhibit similar characteristics. All of the above are compatible with castor oil except for Cargill's modified linseed oil 73-7319 which is compatible with linseed and soya oil and Magie solvent. Cargill's short oil alkyd 74-7451 is additionally compatible with linseed oil at certain concentrations of alkyd.

For the alkyds or other solubility controlling portion and for the ink compositions or varnishes incorporating such compounds as described above, water solubility or washability characteristics depend on the pH of the aqueous solution with which the alkyd, composition or varnish comes into contact. Using the preferred water reducible alkyds or other resins of the present invention, such alkyds and other resins and the resulting compositions or varnishes are water insoluble at a first pH level less than 7.0 and water soluble or washable at a second alkaline pH level greater than 7.0.

The ink composition of the present invention also includes a surfactant component which assists in the aqueous clean up and recovery of the ink composition, but does not significantly affect the print quality of the ink composition. A wide variety of surfactants currently exist. Surfactants are generally classified in three broad classes: anionic, cationic and nonionic. In anionic surfactants, a negative ionic charge is generated which resides on the fatty, or oleophillic portion of the molecule. For cationic surfactants, a positive ionic charge is generated on the oleophillic portion of the molecule. Nonionic surfactants do not generally ionize, but provide an oleophillic end and hydrophilic end to effect the necessary surface activity and wetting characteristics. arious other proprietary surfactants, including amphoteric surfactants have been developed to meet very specialized needs and may also be used in the present invention.

Various surfactants in each of the above categories will be acceptable as a component of the ink composition of the present invention provided the surfactant is compatible with the other components of such composition and in particular the oil and resin components. It has been shown that various anionic surfactants (Emphos PS-400 manufactured by Witco Chemical Co.), cationic surfactants (MQuat 1033 and Mazeen C-5, both manufactured by PPG Industries, formerly Mazer Chemical Co.) and nonionic surfactants (Surfonyl 104 manufactured by Air Products and Mazawett 77 and Macol P4, both manufactured by PPG Industries, formerly Mazer Chemical Co.) have been shown to be acceptable for use in accordance with the present invention. The present invention, however, is not limited to these particular surfactants. Use of compatible surfactants as a part of the ink composition has the effect of improving the water clean up for a particular amount of water reducible resin, without adversely affecting the print quality of the ink. Alternatively, use of compatible surfactants provide comparable water clean up with reduced amounts of the water reducible resin, while still maintaining acceptable print quality.

The particular preferred or optimum amount of water reducible resin and surfactant in the varnish will depend upon various factors which include, among others, the particular components in question, the other components of the varnish and the desired clean up and print quality properties of the ink composition. In general, reduction of the amount of water reducible resin will require an increased amount of surfactant to achieve comparable clean up properties. Preferably for water reducible resin concentrations in the amounts set forth above, the ink composition varnish should include surfactant concentrations in the amount of 1%-20% by weight. More preferably, the surfactant concentrations should be 2%-15% by weight and most preferably 5%-10% by weight of the varnish.

Elevated levels of both the water reducible resin and the surfactant will begin to adversely affect the print quality. Thus, the total amount of water reducible resin and surfactant should be less than 60% and preferably less than about 40%.

Addition of a source of basic ions or free basic groups to the above ink composition results in the solubility controlling portion, and thus the ink composition, being converted to a water soluble or at least a water washable or dispersible form. Such source of basic ions is provided in accordance with the present invention by an alkaline wash solution. The alkaline strength of such wash should be sufficient to render the solubility controlling portion, and thus the ink composition, water washable or dispersible at normal operating or ambient 4%mperatures. Although applicant does not wish to be held to any particular explanation of this conversion, it is believed that the basic ions react with or neutralize the free acid groups of the alkyd or other component, thereby rendering the same water washable or dispersible. This behavior of the solubility controlling portion is then sufficient to render the entire ink composition water washable or dispersible. Such basic ions or groups include various hydroxy groups, amines, quatemary aminos and others known in the art.

In general, the more alkaline the wash solution, the quicker and more effective the ink composition will be removed or dispersed. Preferably a wash solution with a pH in the range of about 8.5 to 14 and most preferably in the range of about 10.5 to 13 is effective to clean up blanket cylinders and rollers containing ink compositions of the present invention by use of a rag or shop towel dipped in the wash solution.

A wide range of alkaline cleaning agents or wash solutions can also be employed with the inks and ink compositions of the present invention. The principal property of such solutions is that they have a pH or source of basic ions sufficient to convert the solubility controlling portion, and thus the ink composition to a water soluble or washable condition. The preferred wash solution contains sodium hydroxide as the basic ion source; however, various other alkaline solutions can be used as well including, without limitation, solutions of the alkali metals, alkali earth metals, ammonium, quaternary ammonium, etc. The use of surfactants, cosolvents and other additives common to the industry may also be used as a part of the wash solution. These tend to reduce the pH or the amount of wash needed to obtain acceptable wash results. Selection of the appropriate surfactant will depend on the particular composition. An example of a surfactant which may be used in the wash is the previously identified nonionic surfactant sold under the tradename Mazawett 77. Certain other nonionic, cationic and anionic surfactants may be used in the wash as well.

Although the preferred embodiment has been described specifically with respect to the water solubility control of a water reducible alkyd component, it is contemplated that other principal portions of the resin component, including the entire resin component itself, may be selected to provide the desired water solubility characteristics, In accordance with the present invention, however, such portions or components must be compatible with each other and with the remainder of the system, must meet the other requirements of the lithographic system including print quality requirements and must, after combination with the other composition components, exhibit aqueous solubility changes in response to changes in pH of the solution with which it is contacted.

The particular pigments, solvents, diluents and other common additives do not appreciably affect the effective free acid associated with the solubility controlling portion and thus water solubility/insolubility behavior of the resulting ink composition.

Fountain solutions useful with the ink composition of the present invention include all commercially available acidic solutions. Preferably, such solutions should be chosen which have a working strength pH less than 6.5, and more preferably less than about 5.5. Additionally, fountain solution additives, such as isopropyl alcohol, alcohol substitutes, antipiling additives and the like can be used successfully with the compositions of the present invention.

In addition to the lithographic ink composition or varnish described above, the present invention relates to various methods based upon a lithographic ink composition or varnish which is water insoluble at certain conditions and water soluble or washable at certain other conditions. Specifically, the method aspects of the present invention include a method or process for making a lithographic ink composition or varnish and a method or process of lithographic printing.

The method of making a lithographic ink composition comprises the steps of combining an oil component, a resin component and a surfactant component wherein such resin and oil components are compatible and wherein the resin component is selected to be generally water insoluble at certain conditions and water soluble or washable at certain other conditions. The surfactant component is selected to be compatible with the other components of the composition and to provide optimum clean up capability without significantly adversely affecting the print quality. More specifically, the above method involves a resin having a solubility controlling portion, and preferably an alkyd or polyester component, in which the water solubility of the polyester or alkyd is such that it is water insoluble at certain pH conditions (preferably acidic) and water soluble or washable at certain other pH conditions (preferably alkaline). Such method further includes combining a solubility controlling portion which, after combination, has sufficient free acid groups to provide it with an effective Acid Number of about 25–150 and preferably about 30–100. Such solubility controlling portion is a water reducible resin whose water solubility behavior is pH dependent and which is compatible with the various other components of the varnish. To exhibit such compatibility, this generally means that it must be water insoluble or oil compatible under certain pH conditions.

The combination of the components in the preparation of a lithographic ink composition is standard in the art. Such combination generally includes charging the varnish components (the oil and resin components) into an agitated vessel, heating the components to a temperature and for a duration sufficient to melt any hard resin components and sufficient for the oil to dissolve the resin and then cooling to room temperature. The surfactants may be added initially with the oil and resin components or after heating. Various pigments, diluents and other additives are combined after the cooling step. Generally, the temperature must be above the glass transition point of the hard resins which is usually in the range of about 300° to 500° F. (189° to 260° C.). The duration of heating or "cooking" is generally about 20–30 minutes. The details of such a process are known in the art.

The method aspect of the present invention also relates to a method of lithographic printing or a method of using the lithographic ink composition of the present invention. Generally, such method includes applying an oil based component and a water based component to a printing plate in which one of the components is an ink composition, transferring the ink composition to a desired medium, and then washing the oil based component with a wash solution having a pH different than that of the water based component. More specifically such method includes the steps of first applying a lithographic ink composition and an aqueous fountain solution to a lithographic printing plate. This aqueous fountain solution has a selected first generally acidic pH in which the oil based lithographic ink composition is generally insoluble and the printing plate has olephilic and oleophobic areas to receive the ink composition and the aqueous fountain solution, respectively. The ink composition which is received by the olephilic areas of the print plate is then transferred to a receiving medium. This can be a sheet of paper or other substrate such as in a direct printing method or can be a blanket positioned on a cylinder such as is common in an offset method.

The final step in the method of using the lithographic ink composition is to wash the printing press or other print components with an aqueous wash solution having a selected second generally alkaline pH. Preferably, the fountain solution is acidic with a pH of less than 6.5 and more preferably less than about 5.5 and the wash solution is alkaline with a pH greater than 8.5 and most preferably greater than about 10.5.

Having described the details of the preferred composition and methods, the following examples with demonstrate the applicability of the present invention. Unless otherwise specified all percentages are "by weight".

Incorporation of Prior Examples

Reference is made to Examples 1-33 of applicant's related application Ser. No. 07/946,762 filed Sep. 17, 1992, which are incorporated herein by reference.

The following examples demonstrate ink compositions containing both a water reducible resin and a surfactant in accordance with the present invention.

EXAMPLES 1-4

Examples 1-4 evaluate the addition of various surfactants to the following ink composition having a short oil alkyd present in an amount of about 22% by weight of the varnish (the ink composition less the pigment). Such ink composition is within the most preferred range for the particular alkyd. An A. B. Dick 375 offset duplicator was inked to an ink film of 1.7 mil (0.0017 inch). Acceptable print quality was obtained. For each example, one hundred sheets were printed and the blanket was washed using water adjusted to pH 13 using sodium hydroxide. The blanket washing step was evaluated qualitatively. The press was then fitted with a wash up blade and the ink was flushed from the rollers using water adjusted to pH 13 with sodium hydroxide. This operation was timed with a stopwatch. It should be noted that 1.7 mil of ink is excessive but was used to exaggerate the roller washing step.

| Ink Composition: | |
|---|---|
| Rosin (Sylvaros R, Arizona Chemical) | 2.7% |
| Alkyd (Cargill 74-7451) AN 47-53 | 18% |
| Linseed Oil (Degen Oil) | 18% |
| Oleic Acid (Emersol 213NF, Henkel Inc.) | 16% |
| Carbon Black (Regal 400R, Cabot Inc.) | 19% |
| Surfactant (see table below) | 2% |

| Example | Surfactant | Blanket Wash | Roller Wash |
|---|---|---|---|
| 1 | [none] | Good | 3:52 |
| 2 | Mazawett 77 | Good | 3:08 |
| 3 | Mazeen C-5 | Good | 3:07 |
| 4 | Emphos PS-400 | Good | 3:44 |

Print quality in all of Examples 1-4 was acceptable. Print quality was evaluated with respect to print density, absence (or presence) of ink in nonimage areas, cleanliness and edge definition. The above Roller Wash clean up times showed an improvement of as much as about 20% when surfactant is part of the composition.

EXAMPLES 5-11

Examples 5-11 demonstrate the ability to reduce the water reducible resin component while still maintaining acceptable print quality and press wash-up performance. The procedure was identical to that of Examples 1-4 except that the ink thickness was maintained at 0.7 mil.

| Ink Composition | |
|---|---|
| Resin (Sylvaros R, Arizona Chemical) | 38.4% |
| Alkyd (Cargill, 74-7451) AN 47-53 | 4% |
| Castor Oil (USP, United Catalyst) | 17.6% |
| Oleic Acid (Emersol 213NF, Henkel Inc.) | 16% |
| Carbon Black (Regal 400R, Cabot Inc.) | 20% |
| Surfactant (See table below) | 5% |

| Example | Surfactant | Surfactant Concentration | Roller Wash |
|---|---|---|---|
| 5 | [None] | — | 5:50 |
| 6 | Surfonyl 104 | 5% | 5:30 |
| 7 | Emphos PS-400 | 5% | 4:51 |
| 8 | Mazawett | 5% | 4:17 |
| 9 | Macol NP4 | 5% | 2:50 |
| 10 | MQuat 1033 | 5% | 4:30 |
| 11 | Mazeen C-5 | 5% | 4:10 |

In Examples 5-11 the Blanket Wash clean up and the print quality was acceptable for all compositions. Roller Wash clean up time showed an improvement of about 20%-50%.

EXAMPLE 12

The procedure of Examples 1-4 was followed with respect to the following ink composition except that the ink thickness was 0.7 mil.

| Ink Composition | |
|---|---|
| Resin (Sylvaros R, Arizona Chemical) | 34.4% |
| Alkyd (Cargill 74-7451) AN 47-53 | 4% |
| Macol NP4 (PPG Industries) | 16% |
| Castor Oil (USP, United Catalyst) | 14.4% |
| Oleic Acid (Emersol 213NF, Henkel Inc.) | 11.2% |
| Carbon Black (Regal 400R, Cabot Inc.) | 20% |

The ink film thickness was 0.7 mil. Both the blanket wash and the print quality were good. The roller clean up time was 4:20 minutes.

EXAMPLE 13

The procedure of Examples 1-4 was followed with respect to the following ink composition except that the ink thickness was 0.7 mil.

| Ink Composition | |
|---|---|
| Resin (Sylvaros R, Arizona Chemical) | 38.4% |
| Alkyd (Cargill 74-7451) AN 47-53 | 2.4% |
| Macol NP4 (PPG Industries) | 2.4% |
| Castor Oil (USP, United Catalyst) | 18.4% |
| Oleic Acid (Emersol 213NF, Henkel Inc.) | 18.4% |
| Carbon Black (Regal 400R, Cabot Inc.) | 20% |

The ink film thickness was 0.7 mil. Both the blanket wash and the print quality were good. The roller clean up time was 3:01 minutes.

In all of the above examples, the concentrations of the various components are shown as a weight percent of the ink composition. To determine weight percent of the varnish, the pigment component must be subtracted.

Although the description of the preferred composition and method have been quite specific, it is contemplated that various modifications could be made without deviating from the spirit of the present invention. Accordingly, it is intended that the scope of the present invention be dictated by the appended claims rather than by the description of the preferred composition and methods.

I claim:

1. An oil based ink composition comprising an ink varnish having a resin component, an oil component and a surfactant component wherein said oil resin and surfactant components are compatible with one another and said resin component includes a first resin component which is substantially water insoluble and a second resin component which is compatible with said first resin component and which comprises a water reducible resin whose water solubility is pH dependent, said second resin component and said surfactant component being present in said ink varnish in an amount sufficient to cause the ink varnish to be substantially water insoluble at acid pH levels and water washable at alkaline pH levels, said second resin component further being present in an amount of at least 2% by weight of said ink varnish and said surfactant further being present in an amount of at least 1% by weight of said ink varnish.

2. The ink composition of claim 1 wherein said second resin component comprises a solubility controlling portion.

3. The ink composition of claim 2 wherein said solubility controlling portion is a water reducible resin.

4. The ink composition of claim 3 wherein said water reducible resin is a water reducible alkyd.

5. The ink composition of claim 1 being a lithographic ink composition.

6. The ink composition of claim 5 wherein said ink varnish includes about 2% to 60% by weight of a compatible water reducible resin and about 1% to 20% by weight of said surfactant component.

7. The ink composition of claim 6 wherein said ink varnish includes about 2% to 15% by weight of said surfactant component.

8. An oil based composition for use in a lithographic printing system comprising an ink varnish having a resin component, an oil component present in an amount of at least 2% by weight of said ink varnish and a surfactant component present in an amount of at least 1% by weight of said ink varnish, each compatible with one another wherein said resin component includes a first resin component which is substantially water insoluble and a second resin component which is compatible with said first resin component and which comprises a water reducible resin whose water solubility is pH dependent, said composition being substantially water insoluble at acid pH levels and water washable at alkaline pH levels.

9. The composition of claim 8 wherein said second resin component comprises a solubility controlling portion.

10. The composition of claim 9 wherein said varnish includes 1%-20% by weight of said surfactant component.

11. The composition of claim 10 wherein said solubility controlling portion is a water reducible alkyd.

12. An ink varnish for use in a lithographic ink composition comprising a resin component including a first resin component which is water insoluble and at least 2% by weight of a second resin component which is substantially water insoluble at acid pH levels and water washable at said alkaline pH levels and about 1%-20% by weight of a compatible surfactant.

13. The ink varnish of claim 12 wherein said second resin component comprises a solubility controlling portion which is present in an amount sufficient to render said resin component substantially water insoluble at said acid pH levels and water washable at said alkaline pH levels.

14. A method for making a lithographic ink varnish comprising the steps of combining an oil component, a compatible resin component and a compatible surfactant component, wherein said resin component includes a water insoluble portion and a solubility controlling portion, said solubility controlling portion being substantially water insoluble at an acid pH and water washable at an alkaline pH and being present in an amount of at least 2% by weight and said surfactant being present in an amount of at least 1% by weight.

15. The method of claim 14 wherein said surfactant component is present in an amount of about 1%-20% by weight.

* * * * *

UNITED STATES PATENT AND TRADEMARK OFFICE
CERTIFICATE OF CORRECTION

PATENT NO. : 5,308,390
DATED : May 3, 1994
INVENTOR(S) : Thomas J. Pennaz

It is certified that error appears in the above-indentified patent and that said Letters Patent is hereby corrected as shown below:

In column 7, line 57, delete "umber" and insert --Number--.

In column 10, line 46, delete "4%emperatures" and insert --temperatures--.

Signed and Sealed this

Twenty-ninth Day of November, 1994

Attest:

BRUCE LEHMAN

*Attesting Officer*   *Commissioner of Patents and Trademarks*